United States Patent
Lin et al.

(10) Patent No.: US 7,968,424 B2
(45) Date of Patent: Jun. 28, 2011

(54) METHOD OF IMPLANTATION

(75) Inventors: Jeng-Shyan Lin, Tainan (TW);
Dun-Nian Yaung, Taipei (TW);
Jen-Cheng Liu, Hsin-Chu (TW);
Chun-Chieh Chuang, Tainan (TW);
Pao-Tung Chen, Tainan Hsien (TW);
Wen-De Wang, Minsyong Township, Chiayi County (TW); Jyh-Ming Hung, Dacun Township, Changhua County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/355,211

(22) Filed: Jan. 16, 2009

(65) Prior Publication Data
US 2010/0184242 A1 Jul. 22, 2010

(51) Int. Cl.
*H01L 21/76* (2006.01)
(52) U.S. Cl. .......... 438/433; 438/57; 438/423; 438/434; 438/449; 438/450; 257/E21.551

(58) Field of Classification Search .................. 438/433, 438/434, 450; 257/E21.551
See application file for complete search history.

(56) References Cited

U.S. PATENT DOCUMENTS

| 5,482,889 | A | * | 1/1996 | Yokoyama | 438/450 |
| 5,691,233 | A | * | 11/1997 | Matsumoto | 438/439 |
| 5,786,265 | A | * | 7/1998 | Hwang et al. | 438/450 |
| 5,861,338 | A | * | 1/1999 | Hu | 438/450 |
| 5,888,871 | A | * | 3/1999 | Cho et al. | 438/263 |
| 2004/0253761 | A1 | * | 12/2004 | Rhodes et al. | 438/84 |
| 2005/0139877 | A1 | * | 6/2005 | Rhodes et al. | 257/292 |
| 2005/0218436 | A1 | * | 10/2005 | Yamaguchi et al. | 257/292 |
| 2008/0057612 | A1 | * | 3/2008 | Doan et al. | 438/57 |

* cited by examiner

*Primary Examiner* — Angel Roman
(74) *Attorney, Agent, or Firm* — Haynes and Boone, LLP

(57) ABSTRACT

Provided is a method of implanting dopant ions to an integrated circuit. The method includes forming a first pixel and a second pixel in a substrate, forming an etch stop layer over the substrate, forming a hard mask layer over the etch stop layer, patterning the hard mask layer to include an opening between the first pixel and the second pixel, and implanting a plurality of dopants through the opening to form an isolation feature.

20 Claims, 9 Drawing Sheets

METHOD OF IMPLANTATION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

The scaled down semiconductor ICs have been used in a variety of applications. In some applications, these ICs may include pixels for sensing radiation, such as photo or light. As these ICs continue to get scaled down, pixel sizes continue to shrink as well, which may lead to noise problems such as "cross-talk" (or signal interference) that may degrade the IC's photo performance. Traditional technologies may not be effective at reducing the cross-talk between pixels in an IC and may not achieve desired photo response characteristics.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
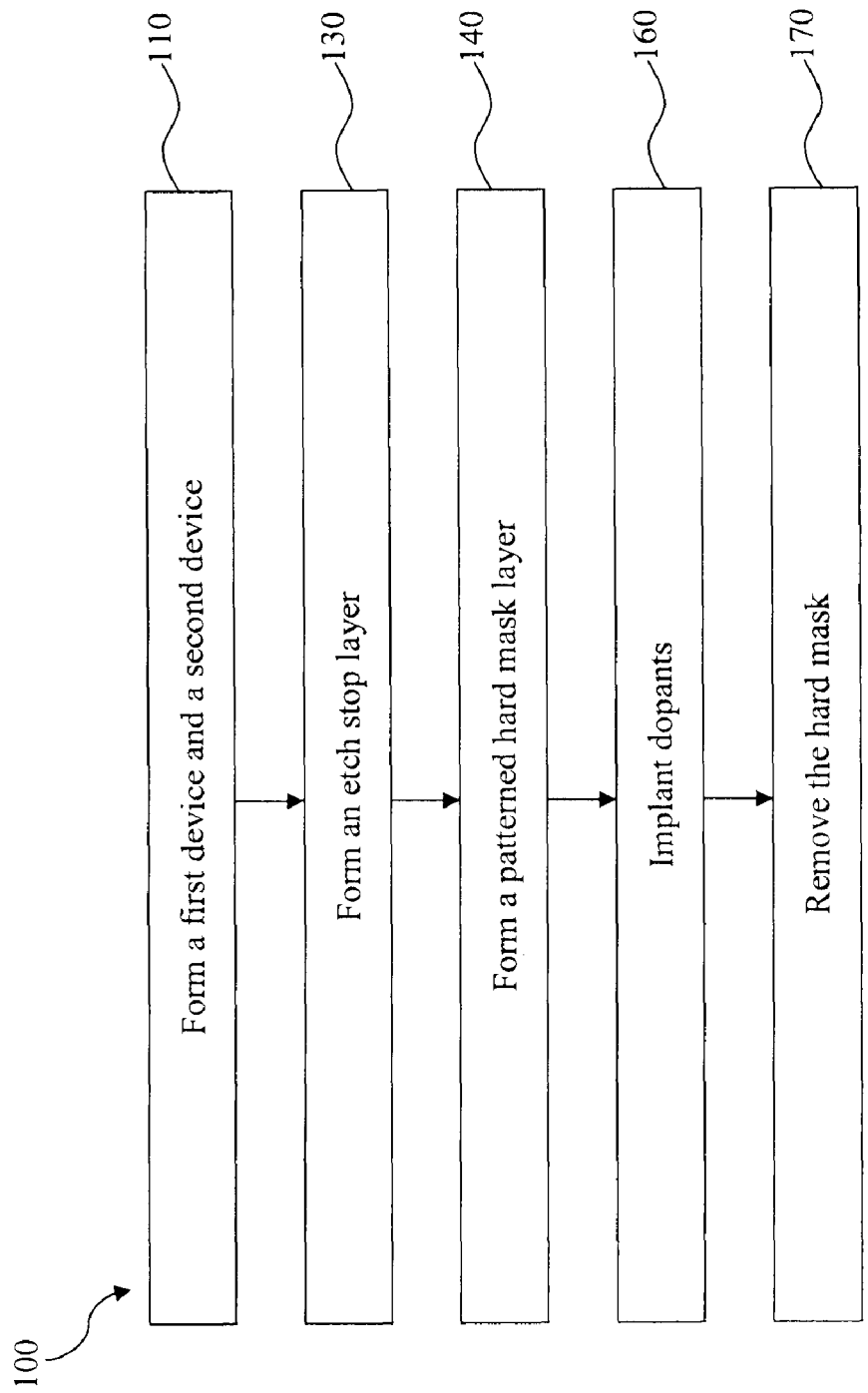
FIG. 1 is a flowchart illustrating a method for implanting dopant ions to an integrated circuit according to various aspects of the present disclosure.
Figure 2A:
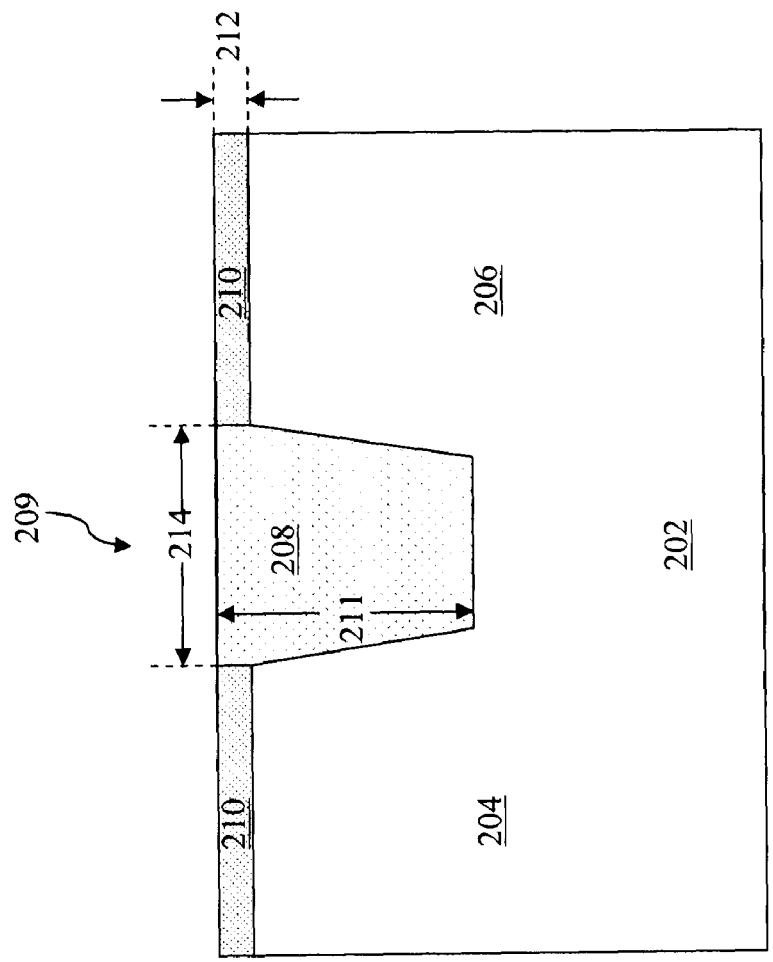
FIGS. 2A-2G are cross-sectional views of an integrated circuit at various stages of fabrication according to the method of FIG. 1.
Figure 2B:
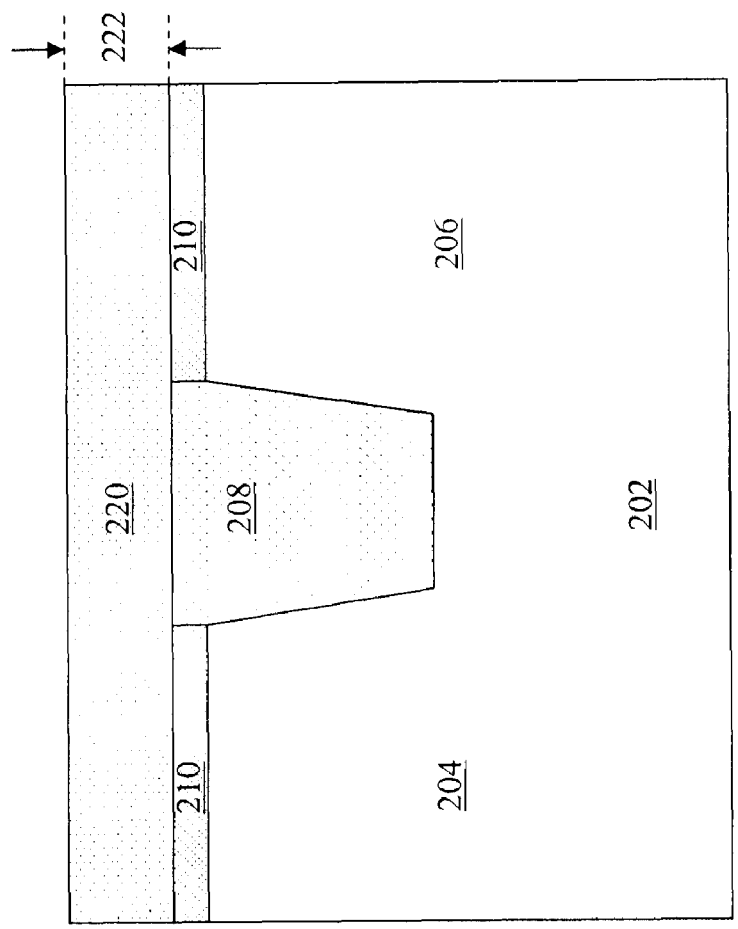
Figure 2C:
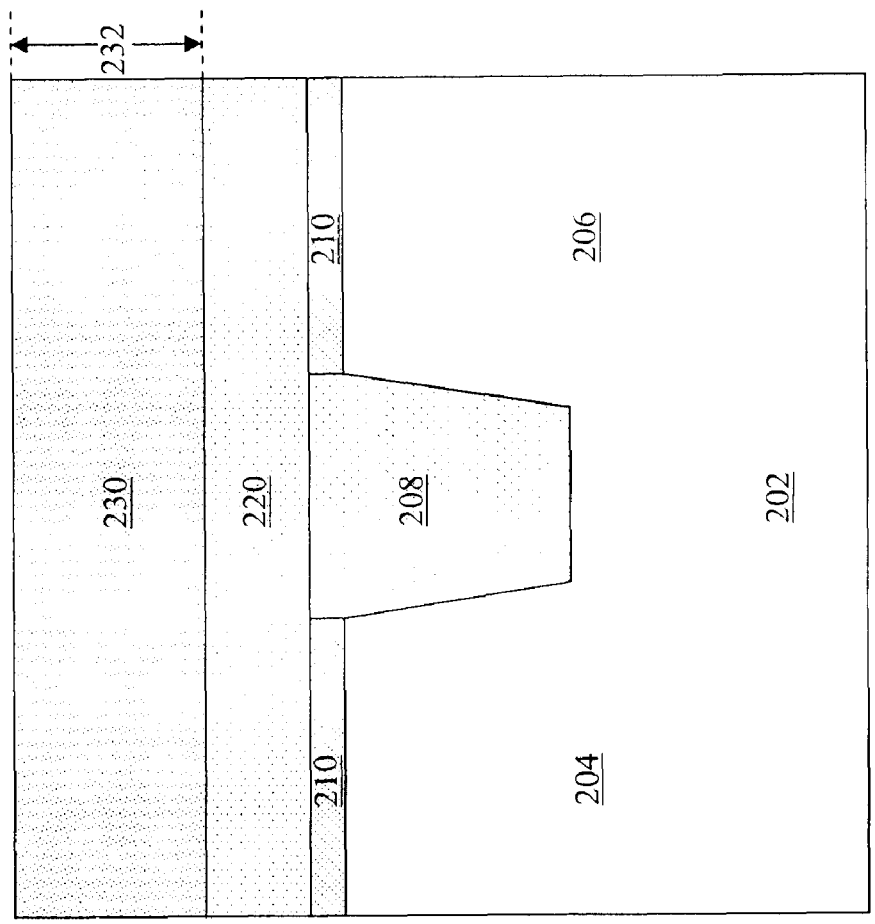
Figure 2C:
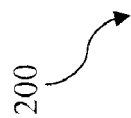

Illustrated in FIG. 1 is a flowchart of a method 100 for implanting dopant ions to an integrated circuit according to various aspects of the present disclosure. FIGS. 2A to 2G are cross-sectional views of one embodiment of an integrated circuit at various stages of fabrication according to the method 100 of FIG. 1. FIG. 3 is a cross-sectional view of an exemplary embodiment of an integrated circuit fabricated according to the method of FIG. 1. It is understood that FIGS. 2A to 2G have been simplified for a better understanding of the inventive concepts of the present disclosure. The integrated circuit 200 may be an IC chip, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the integrated circuit 200 may be fabricated with a CMOS process flow. Accordingly, it is understood that additional processes may be provided before, during, and after the method 100 of FIG. 1, and that some other processes may only be briefly described herein.

Referring to FIG. 1, the method 100 begins with block 110 in which a first device and a second device are formed. Referring to FIG. 2A, an integrated circuit 200 having a substrate 202 and devices 204 and 206 is illustrated. In the present embodiment, the substrate 202 is a P-type substrate doped with P-type dopants such as boron. In another embodiment, the substrate 202 is a lightly doped N-type substrate doped with N-type dopants such as arsenic or phosphorous. The devices 204 and 206 may be diodes, transistors, or other circuit elements, and the devices 204 and 206 may be same or different. In the present embodiment, the device 204 and 206 are photo diodes each having an N-type region and a P-type region. For the sake of example, the following disclosure will discuss an embodiment with two photo diodes 204 and 206.

The photo diodes 204 and 206 are operable to sense light and may be referred to as pixels or light sensor elements. The N-type regions of devices 204 and 206 are N-wells formed by doping the substrate 202 with an N-type dopant such as arsenic or phosphorous. In the present embodiment, the N-type regions include a doping concentration ranging from about $2 \times 10^{17}$ atoms/cm$^3$ to about $2 \times 10^{19}$ atoms/cm$^3$. The depths of the N-type regions may be varied by tuning an implantation energy. As the depths vary, the devices 204 and 206 are operable to sense different spectra of light. In the present embodiment, the depths of the N-type regions range from about 1.0 um to about 1.5 um. The P-type regions of the devices 204 and 206 may be formed by doping the substrate 202 with a P-type dopant such as boron. In the present embodiment, the P-type regions are portions of the P-type substrate 202 and include a doping concentration ranging from about $10^{14}$ atoms/cm$^3$ to about $10^{17}$ atoms/cm$^3$. In the present embodiment, radiation (such as light) is collected (or sensed) by electrons in the N-type regions of the devices 204 and 206. If the light sensing electrons diffuse from device 204 to adjacent device 206 or vice versa, a light sensing error called "cross-talk" may occur. The light sensing error degrades the integrated circuit 200's desired photo response characteristics. One of the advantages of the present embodiment is that the cross-talk between adjacent devices is reduced. It is also understood that the sequence of the formation of features is not required. For example, the devices 204 and 206 may be formed at the end of the method 100.

Continuing with the example of FIG. 2A, a shallow trench isolation (STI) 208 is formed in the substrate 202 between the devices 204 and 206. The formation of the STI 208 may include several steps. In the present embodiment, a pad oxide layer is formed over the substrate 202 first. The pad oxide layer includes silicon oxide and is patterned by a photoresist mask, wherein a middle portion of the pad oxide layer is etched away. Afterwards, using un-etched portions of the pad oxide layer as masks, a portion of the substrate 202 unprotected by the pad oxide mask is removed to form a trench region 209. The trench 209 is then filled with a dielectric material to form the STI 208. The dielectric material of the STI 208 may include silicon oxide, silicon nitride, silicon oxy-nitride, fluoride-doped silicate (FSG), and/or a low-k dielectric material known in the art. In the present embodiment, the dielectric material includes silicon oxide. The STI 208 also has a thickness 211 ranging from about 500 angstroms to about 5000 angstroms. In the present embodiment, the STI 208 has a thickness 211 of about 3000 angstroms, and the STI 208 also has a maximum width 214 less than about 1 um.

Continuing with the example of FIG. 2A, a dielectric layer 210 is then formed over the devices 204 and 206 on either side of the STI 208. In one embodiment, the dielectric layer 210 may include a portion of the un-etched pad oxide layer. In the present embodiment, the pad oxide layer is removed by a method such as chemical-mechanical-polishing (CMP). The dielectric layer 210 is then formed over the devices 204 and 206 on either side of the STI 208. In this embodiment, the dielectric layer 210 may be used as a gate dielectric of a gate stack for a transistor and may act as a gate dielectric. The dielectric layer 210 includes a thermal silicon oxide material in the present embodiment. The dielectric layer 210 may also include a high-k dielectric material such as halfnium oxide $HfO_2$ or halfnium silicon oxide (HfSiO). The dielectric layer 210 may be formed by a process such as thermal oxidation, chemical vapor deposition (CVD), or atomic layer deposition (ALD). The formation process may be tuned to control a thickness 212 of the dielectric layer 210. It may be desired to have a greater thickness 212 for a higher gate voltage. For example, in one embodiment, the dielectric layer 210 has a thickness 212 of about 70 angstroms for a gate voltage of about 3.3 V. In another embodiment, the dielectric layer 210 has a thickness 212 of about 50 angstroms for a gate voltage of about 2.5 V. In yet another embodiment, the dielectric layer 210 has a thickness 212 of about 20 angstroms for a gate voltage of about 1.2 V.

The method 100 continues with block 130 in which an etch stop layer is formed. Referring now to FIG. 2B, a layer 220 is formed over the substrate 202. The layer 220 may be formed by a CVD process or another suitable process. In the present embodiment, the layer 220 includes a polysilicon (poly) material which may be used later to form a poly gate in a gate-first process or a dummy poly gate in a gate-last process. In another embodiment, the layer 220 includes a silicon nitride material. The layer 220 has a thickness 222 ranging from about 300 angstroms to about 5000 angstroms. In the present embodiment, the layer 220 has a thickness 222 of about 1500 angstroms.

The method 100 continues with block 140 in which a patterned hard mask is formed. Referring to FIG. 2C, a hard mask layer 230 is formed over the layer 220 in the present embodiment. The hard mask layer 230 includes silicon oxide. In another embodiment, the hard mask layer 230 includes silicon oxy-nitride. The hard mask layer 230 may be formed using methods such as CVD, physical vapor deposition (PVD), or ALD. It is understood that other techniques may be used to pattern the hard mask layer 230. The hard mask layer 230 also has a thickness 232 ranging from about 0.1 um to about 10 um. In the present embodiment, the hard mask layer 230 has a thickness 232 of about 2 um.

Figure 2D:
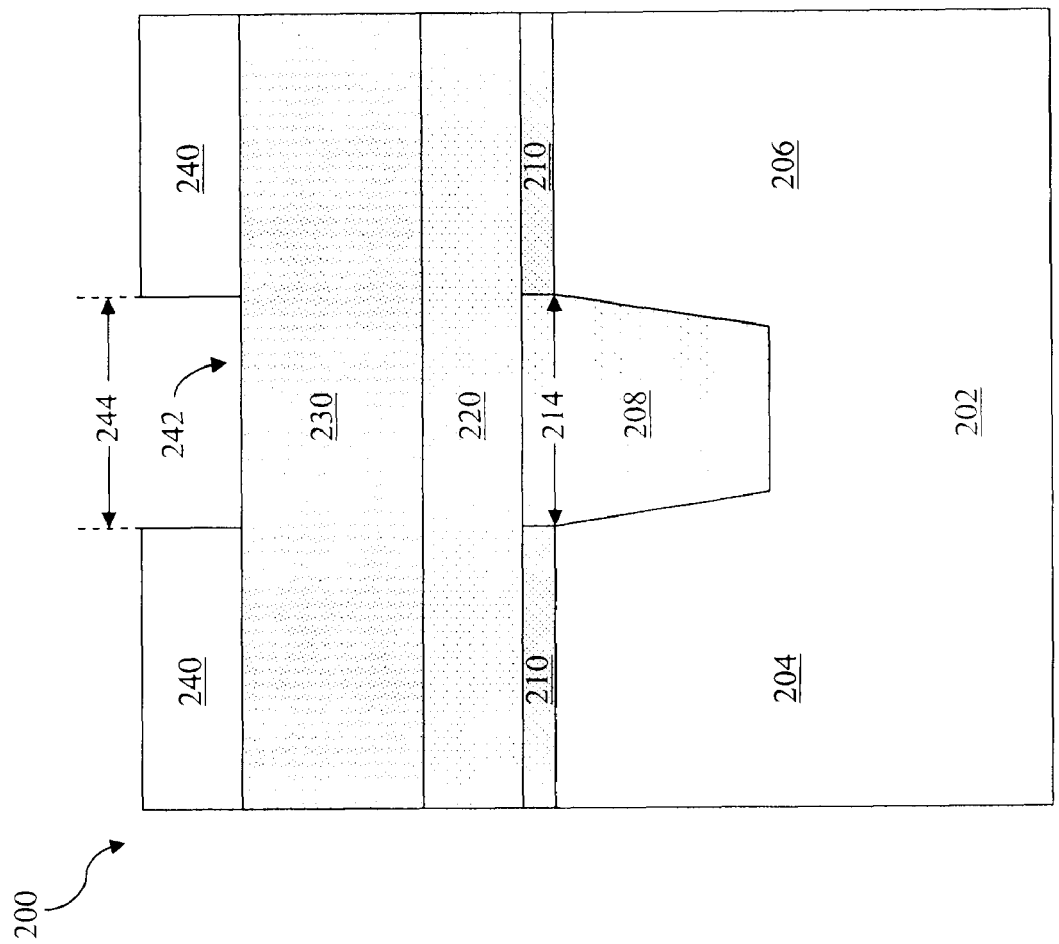
Figure 3:
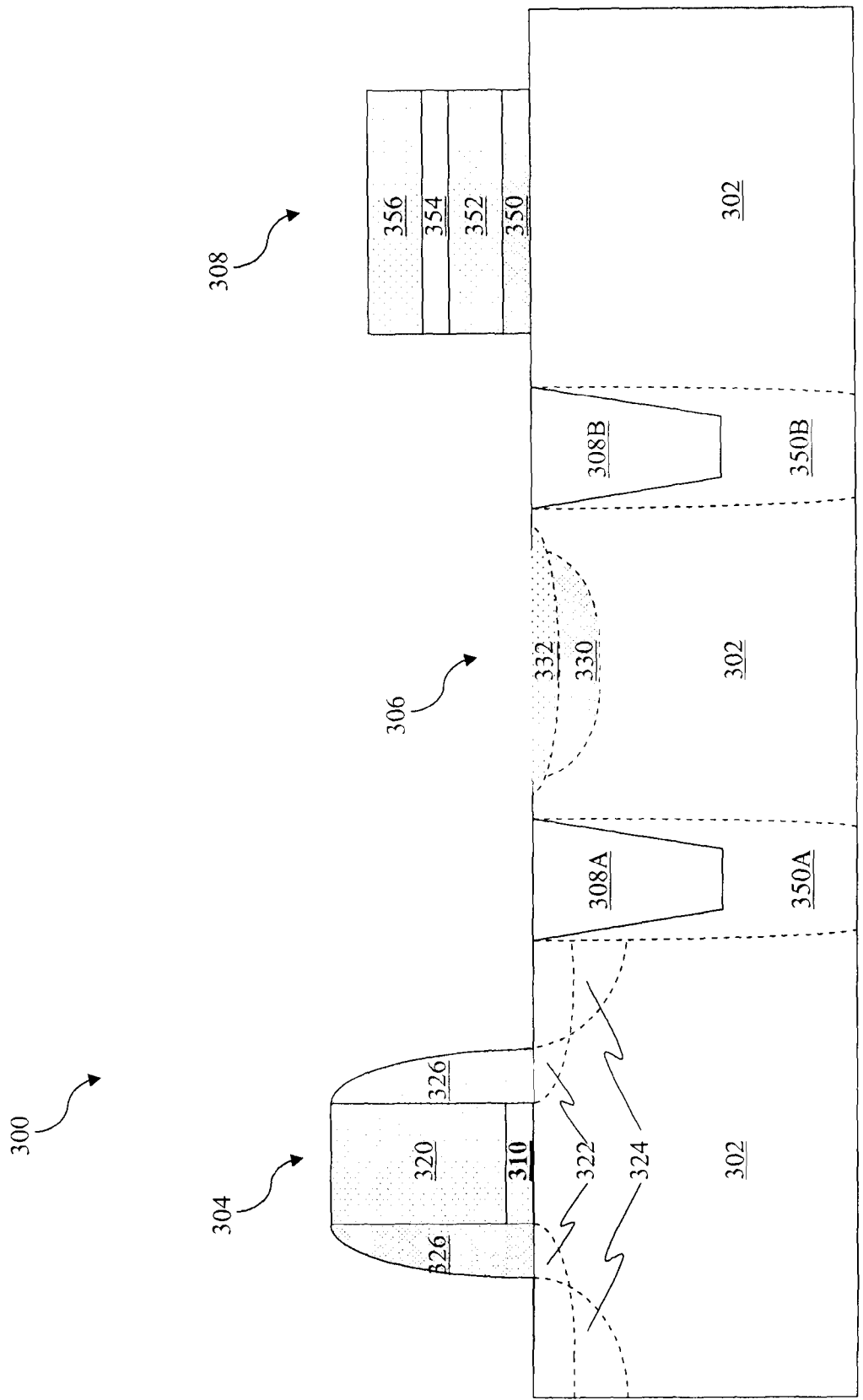
FIG. 3 is a cross-sectional view of an exemplary embodiment of an integrated circuit fabricated according to the method of FIG. 1.

Referring now to FIG. 2D, a patterned photoresist layer 240 is formed over the hard mask layer 230. The patterned photoresist layer 240 may be formed by photolithography, immersion lithography, ion-beam writing, or other suitable processes. For example, the photolithography process may include spin coating, soft-baking, exposure, post-baking, developing, rinsing, drying, and other suitable processes. The patterned photoresist layer 240 includes an opening 242 exposing a portion of the hard mask layer 230 below. In the present embodiment, the opening 242 has a width 244 approximately equal to the maximum width 214 of the STI 208.

Figure 2E:
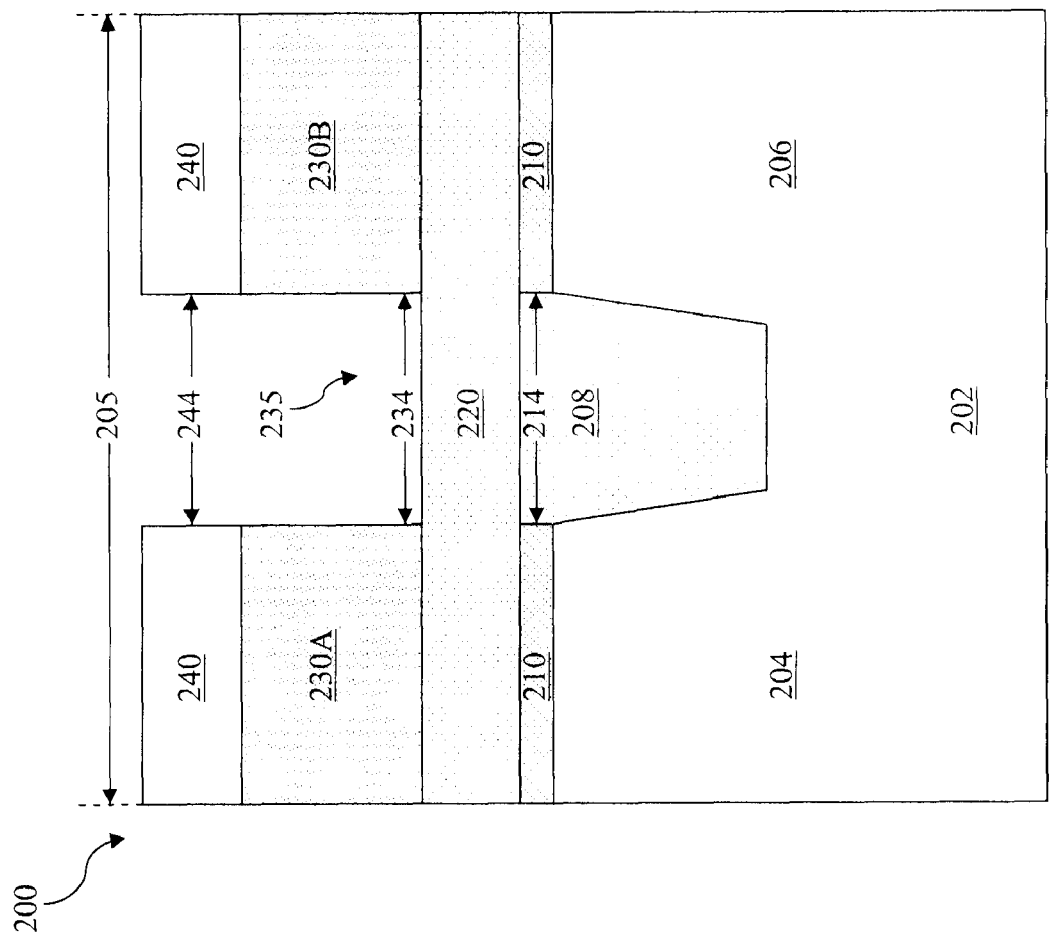

Referring now to FIG. 2E, the exposed portion of the hard mask layer 230 is removed with a suitable etching process, thereby forming a portion 230A operable to cover the device 204 and a portion 230B operable to cover the device 206. The portions 230A and 230B may also be referred to as implantation mask features. The opening 235 may also be referred to as an implant open area 235 since dopant ions may be implanted to the substrate 202 through the opening 235. The width 234 of the opening 235 may be critical and may be desired to be small. As mentioned before, current technological advances require an increasingly smaller integrated circuit 200. An overall width 205 of the integrated circuit 200 may partially define a size of the integrated circuit 200. In an embodiment where devices 204 and 206 are light sensing pixels, the integrated circuit 200 may have a fixed size (or width 205). Consequently, a narrower opening 235 allows pixels 204 and 206 to have a wider surface area so that more light signals may be sensed, and the pixels 204 and 206 may exhibit better photo response characteristics. Therefore, a smaller width 234 of the opening 235 separating the portions 230A and 230B may be desired. An advantage of the present embodiment is that the opening 235 is formed with portions 230A and 230B, which both include a silicon oxide or a silicon oxy-nitride material. The use of oxide or an oxy-nitride material allows the portions 230A and 230B to form a smaller opening 235 compared to an opening formed by traditional methods, which may use photoresist to form the opening. The patterned photoresist layer 240 is then removed by a stripping or ashing process.

Figure 2F:
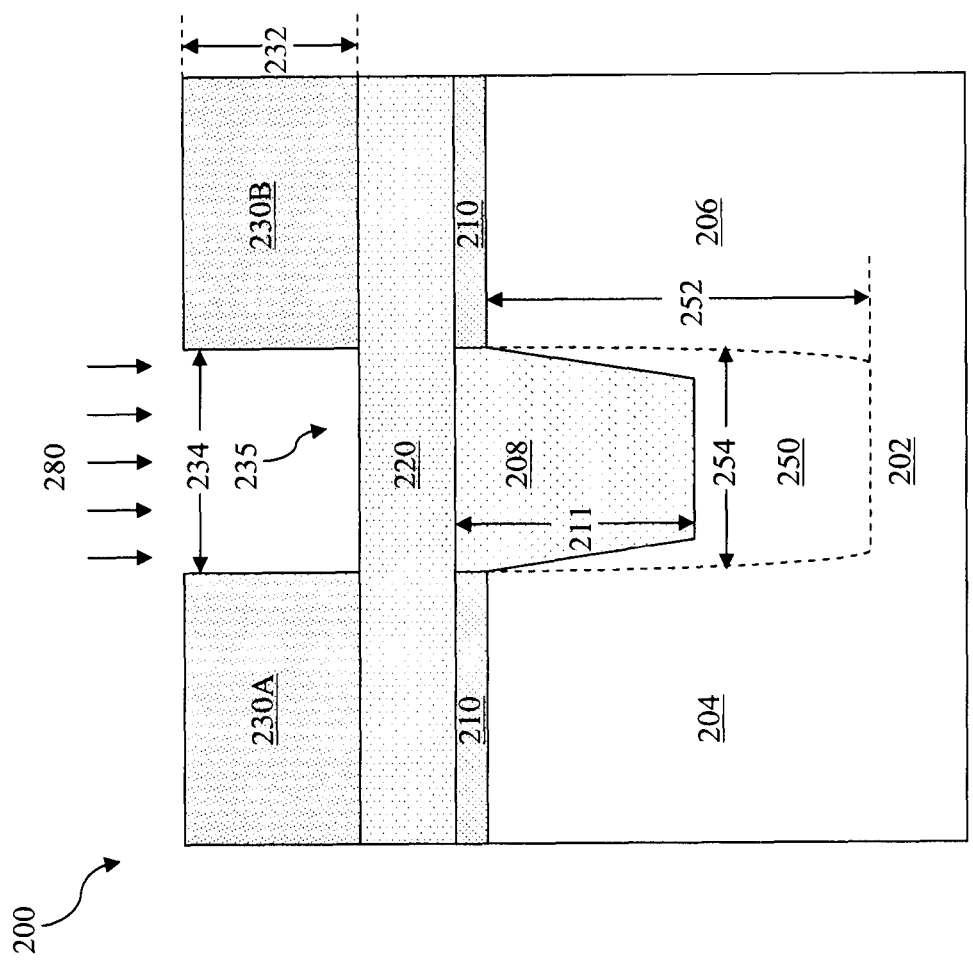

The method 100 continues with block 160 in which dopants are implanted into a second region of the substrate. Referring now to FIG. 2F, in the present embodiment, an implantation process 280 is performed to the integrated circuit 200, wherein a plurality of P-type dopant ions, such as boron ions, are implanted to a region 250, in the substrate 202. The region 250 may be formed below the STI 208 such that the region 250 partially surrounds the STI 208. Since the region 250 is doped with a P-type dopant, the region 250 may also be referred to as a P-well 250. The portions 230A and 230B may be used as masks (or implant shields) during the implantation process 280 to prevent the P-type dopant ions from penetrating into the devices 204 and 206, since the implantation process 280 may damage devices 204 and 206, particularly as an implantation energy of the implantation process 280 increases. Thus, the region 250 formed by the implantation process 280 has a maximum width 254 approximately equal to the width 234 of the opening 235. Also, as the thickness 232 of the portions 230A and 230B increases, the portions 230A and 230B may be more effective in blocking ion penetration. Both portions 230A and 230B include a silicon oxide or a silicon oxy-nitride material, which may allow for a greater thickness 232 compared with other materials. Further, the silicon oxide or silicon oxy-nitride material itself in portions 230A and 230B may be more effective in blocking dopant ions than other materials. Consequently, by using portions 230A and 230B as masks during the implantation process 280, a greater implantation energy may be used without damaging devices 204 and 206.

The region 250 includes a depth 252 that may be changed by varying the implantation energy of the implantation process 280. In the present embodiment, the implantation energy is greater than 50 kilo electron-volts (KeV), and the depth 252 of the region 250 ranges from about 0.3 um to about 2 um. In another embodiment, the implantation energy is greater than 1 mega electron-volts (MeV). The implantation process 280 also includes a dopant ion dose level ranging from about $1\times10^{11}$ atoms/cm$^2$ to about $1\times10^{15}$ atoms/cm$^2$. In the present embodiment, the dose level of the implantation process 280 is about $1\times10^{13}$ atoms/cm$^2$. The region 250 formed by the implantation process 280 has a doping concentration ranging from about $1\times10^{15}$ atoms/cm$^3$ to about $1\times10^{19}$ atoms/cm$^3$. In the present embodiment, the doping concentration of the region 250 is about $1\times10^{17}$ atoms/cm$^3$. As is illustrated by FIG. 2F, the depth 252 of the region 250 is greater than the depth 211 of the STI 208 in the present embodiment. The region 250 may reduce cross-talk between devices 204 and 206, since the electrons in the N-type regions of the devices 204 and 206 may be information carriers with regards to light, and the heavily doped region 250 may serve as an isolation feature to prevent electron carrier diffusion from device 204 to device 206 or vice versa. It is also understood that the STI 208 and the region 250 together may be considered as an isolation feature. An advantage of the present embodiment is that the region 250 may be doped with a high implantation energy due to the use of silicon oxide or silicon oxy-nitride hard masks 230A and 230B, as mentioned above. Consequently, the region 250 formed by the implantation process 280 may have a greater depth 252 and thus may be more effective as an isolation feature between the devices 204 and 206.

In an alternative embodiment, the implantation process 280 is performed before the photoresist layer 240 is removed. In yet another alternative embodiment, the STI 208 is not formed, and the heavily doped region 250 itself is used as an isolation feature. In another embodiment, the substrate 202 is an N-type substrate or a lightly doped P-type substrate, and the devices 204 and 206 are pixels having P-type regions operable to sense light, and the isolation feature 250 is a heavily doped N-well. These alternative embodiments are consistent with the scope and the spirit of the invention.

Figure 2G:
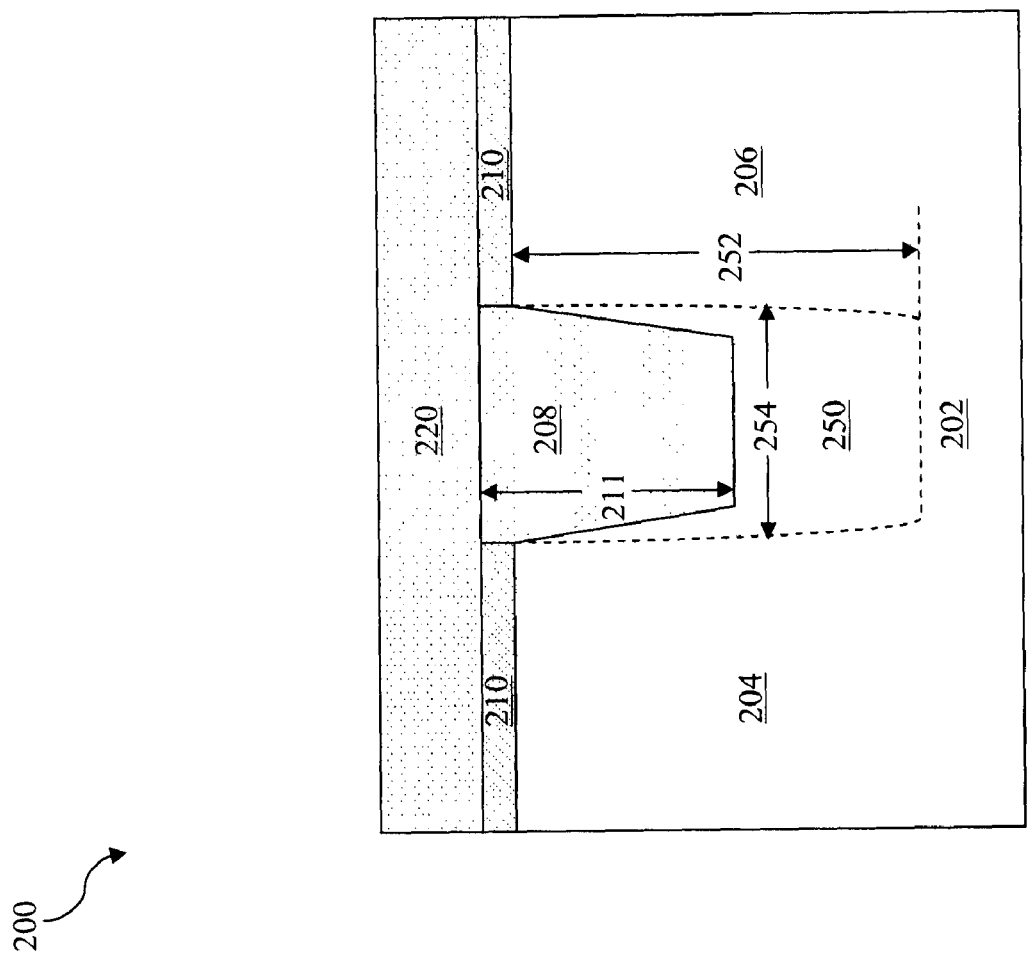

The method 100 continues with block 170 in which the hard mask is removed. Referring now to FIG. 2G, after the implantation process 280 is performed, the portions 230A and 230B are removed by a suitable process such as a wet etching process. The layer 220 may be used as an etch stop layer since the layer 220 may have sufficient etching selectivity with the portions 230A and 230B. Hence, removal of the portions 230A and 230B does not remove the etch stop layer 220. It is also understood that the method 100 may continue with additional steps to complete the fabrication of the integrated circuit 200. For example, as mentioned before, the layer 220 may be patterned to form a poly gate in a gate-first process or a dummy poly gate in a gate-last process. In addition, a plurality of patterned dielectric layers and conductive layers may be formed over the substrate 202 to form multilayer interconnects configured to couple the various doped regions of the devices 204 and 205. For example, an interlayer dielectric (ILD) and a multilayer interconnect (MLI) structure may be formed in a configuration such that the ILD separates and isolates each MLI structure from other MLI structures. In furtherance of the example, the MLI structure includes contacts, vias and metal lines formed on the substrate 202. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including CVD, PVD, sputtering, or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

As mentioned previously, the devices 204 and 206 separated by the isolation feature 250 and STI 208 may be a variety of semiconductor devices, and devices 204 and 206 may be different devices. FIG. 3 illustrates an exemplary embodiment of a integrated 300. In FIG. 3, a transistor 304, a photo diode 306, and a capacitor 308 are formed on a substrate 302. The transistor 304 and the photo diode 306 are separated by a shallow trench isolation (STI) 308A and a doped isolation feature 350A. The photo diode 306 and the capacitor 308 are separated by an STI 308B and a doped isolation feature 350B. The STIs 308A and 308B are similar to the STI 208 described previously. The doped isolation features 350A and 350B are also similar to the isolation feature 250 described previously. The transistor 304 includes a gate dielectric 310, which may be formed from the dielectric layer 210 described previously. The transistor 304 also includes poly gate 320, which may be formed, at least in part, from the layer 220 described previously. Further, the transistor 304 has lightly doped source/drain regions 322 and heavy dope source/drain regions 324. The transistor 304 also includes spacers 326. The photo diode 306 includes a buried signal sensing region 330 doped with an N-type dopant such as phosphorous or arsenic. The photo diode 306 also includes an extra shallow region 332 doped with a P-type dopant such as boron. The extra shallow region 332 protects the buried signal sensing region 330 below. Electrons in the N-type region 330 are used to sense radiation such as light. The substrate 302 is doped with a P-type dopant such as boron. In an alternative embodiment, the buried signal sensing region 330 is doped with a P-type dopant such as boron, and the extra shallow region 332 is doped with an N-type dopant such as phosphorous or arsenic, and the substrate 302 is doped with an N-type dopant such as phosphorous or arsenic. The photo diode 306 may also be referred to as a buried photo diode 306.

Further, the capacitor 308 is formed on the substrate 302 and includes a buffer layer 350. The buffer layer 350 may be formed from the dielectric layer 210 described previously. The capacitor 308 also includes a dielectric material 354 sandwiched in between parallel plates 352 and 356. The dielectric material 354 may include silicon oxide, silicon nitride, or silicon oxy-nitride. The parallel plates 352 and 356 may include metal or polysilicon. In the embodiment shown in FIG. 3, the dielectric material 354 is silicon oxide, and the parallel plates 352 and 356 are polysilicon. The plate 352 may be formed from the layer 220 previously described. It is understood that the integrated circuit 300 may include additional devices separated by additional isolation features not shown in FIG. 3.

In summary, the methods and devices disclosed herein provide an effective and efficient approach for implanting dopant ions into an integrated circuit. The method and devices include forming a dielectric layer over devices in the substrate such as light sensor pixels, forming an etch stop layer over the dielectric layer, forming a hard mask layer over the etch stop layer, and patterning the hard mask layer to form implantation mask features. In doing so, the present embodiment offers several advantages over prior art devices, it being understood that different embodiments may have different advantages. One advantage of the present embodiment is that the use of silicon oxide or silicon oxy-nitride hard masks allows for a smaller implant open area and therefore a larger pixel area, which may exhibit better photo response characteristics. Another advantage of the present embodiment is that the use of silicon oxide or silicon oxy-nitride hard masks allows for thicker implantation mask features, and thus a greater implantation energy may be used in the implantation process. The greater implantation energy may form a doped region having a deeper depth, wherein the doped region may serve as an isolation feature. The greater the depth of the isolation feature, the more effective the isolation may be at preventing carrier diffusion between adjacent pixels, which reduces cross-talk and improves pixel sensing accuracy. One more advantage of the present embodiment is that the etch stop layer may be used as an etch stop layer for removing the implantation mask feature, and the etch stop layer may also be used to form other structures of the integrated circuit. Furthermore, the dielectric layer may be used as a gate dielectric.

The present disclosure describes a method for fabricating a semiconductor device, including forming a first pixel and a second pixel in a substrate. A first isolation feature is formed in a first region of the substrate. The first region is between the first pixel and the second pixel. An etch stop layer is formed over the substrate. A hard mask layer is formed over the etch stop layer. The hard mask layer is patterned to include an opening area between two adjacent pixels. A plurality of dopants are implanted through the opening, thereby forming a second isolation feature.

The present disclosure also describes a method for fabricating a semiconductor device, including forming a pixel and a device in a substrate. A first isolation feature is formed in the substrate. The first isolation feature is between the pixel and the device. A polysilicon layer is formed over the substrate. A hard mask layer is formed over the polysilicon layer. The hard mask layer is patterned to form a first portion operable to cover the pixel and a second portion operable to cover the device. A plurality of dopant ions are implanted into a region of the substrate between the pixel and the device to form a second isolation feature. Sometimes, the second isolation feature is below the first isolation feature.

The present disclosure also describes a method for fabricating a semiconductor device, including forming a first device and a second device in a substrate. The first and second devices may include photo diodes, transistors, or other circuit elements. An etch stop layer is formed over the substrate. A hard mask layer is formed over the etch stop layer. The hard mask layer is patterned to form a first portion operable to cover the first device and a second portion operable to cover the second device. A plurality of dopant ions are implanted into a region of the substrate to form a doped isolation feature between the first and second devices.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a semiconductor substrate;
   forming a first isolation feature in the substrate;
   forming an etch stop layer over the substrate and the first isolation feature;
   forming a hard mask layer over the etch stop layer;
   patterning the hard mask layer to include an opening over the first isolation feature;
   implanting a plurality of dopants to the substrate through the opening and through the first isolation feature;
   removing the hard mask layer;
   patterning the etch stop layer to form a portion of a gate structure.

2. The method of claim 1 further comprising:
   forming a first pixel and a second pixel in the substrate prior to forming the first isolation feature;
   wherein the forming the first isolation feature includes forming the first isolation feature in a first region of the substrate, wherein the first region is between the first pixel and the second pixel; and
   wherein the opening of the patterned hard mask layer is between the first pixel and the second pixel.

3. The method of claim 2, wherein the substrate is doped with a first dopant, and the first and second pixels include a signal sensing region doped with a second dopant, wherein the first and second dopants are different types of dopants.

4. The method of claim 3, wherein the signal sensing region is protected by a shallow region doped with a third dopant that is a different type of dopant than the second dopant.

5. The method of claim 3, wherein implanting the plurality of dopants includes doping to form a second isolation feature with a fourth dopant, wherein the fourth dopant and first dopant are same types of dopants, and wherein the second isolation feature has a higher doping concentration than the substrate.

6. The method of claim 5, wherein the second isolation feature has a doping concentration ranging from about $1 \times 10^{15}$ atoms/cm$^3$ to about $1 \times 10^{19}$ atoms/cm$^3$, and the substrate has a doping concentration ranging from about $10^{14}$ atoms/cm$^3$ to about $10^{17}$ atoms/cm$^3$.

7. The method of claim 4, wherein the first dopant and the third dopant each includes boron, and the second dopant includes arsenic or phosphorous.

8. The method of claim 1, wherein implanting a plurality of dopants includes implanting boron ions with an implantation energy greater than 50 KeV and a dose level ranging from about $1 \times 10^{11}$ atoms/cm$^2$ to about $1 \times 10^{15}$ atoms/cm$^2$.

9. A method of fabricating a semiconductor device, comprising:
   providing a semiconductor substrate having spaced first and second regions;
   forming a pixel in the first region of the substrate;

forming a first isolation feature in the substrate between the first region and the second region;

forming a polysilicon layer over the substrate and the first isolation feature;

forming a hard mask layer over the polysilicon layer;

patterning the hard mask layer to form a first portion operable to cover the pixel in the first region and a second portion operable to cover the second region, the patterning exposing a segment of the polysilicon layer over the first isolation feature;

implanting a plurality of dopant ions through the segment of the polysilicon layer and the first isolation feature and into the substrate below the first isolation feature, thereby forming a second isolation feature;

removing the first and second portions of the hard mask layer; and forming a logic device over the second region after removing the second portion, the forming including patterning the polysilicon layer to form a gate portion of the logic device.

10. The method of claim 9, further including:

prior to forming the polysilicon layer, forming a gate dielectric layer over the first and second regions.

11. The method of claim 10, wherein the forming the logic device after removing the first and second portions, includes patterning the gate dielectric layer to form a gate dielectric portion of the logic device.

12. The method of claim 11, wherein the gate dielectric layer has a thickness ranging from about 10 angstroms to about 250 angstroms, and the polysilicon layer has a thickness ranging from about 300 angstroms to about 5000 angstroms.

13. The method of claim 9, wherein the hard mask layer has a thickness ranging from about 0.1 um to about 10 um.

14. The method of claim 13, wherein a distance separating the first and second portions of the hard mask layer is less than about 1 um.

15. The method of claim 14, wherein the first isolation feature includes a shallow trench isolation having a thickness ranging from about 500 angstroms to about 5000 angstroms, and the second isolation feature includes a P-well having a depth ranging from about 0.3 um to about 2 um.

16. The method of claim 15, wherein the P-well is formed by an implantation process using boron ions as dopants, wherein the implantation process includes an implantation energy greater than 50 KeV and a dose level ranging from about $1\times10^{11}$ atoms/cm$^2$ to about $1\times10^{15}$ atoms/cm$^2$.

17. A method of fabricating a semiconductor device, comprising:

providing a semiconductor substrate having spaced first and second regions;

forming a photo diode in the first region;

forming a first isolation feature in the substrate between the first and second regions;

forming an etch stop layer over the substrate and over the first isolation feature;

forming a hard mask layer over the etch stop layer;

patterning the hard mask layer to form a first portion operable to cover the photo diode in the first region and a second portion operable to cover the second region, the patterning creating an opening in the hard mask layer over the first isolation feature;

implanting a plurality of dopant ions through the opening and the first isolation feature and into the substrate below the first isolation feature to form a second isolation feature between the first and second regions;

removing the first and second portions of the hard mask layer; and forming a capacitor over the second region after removing the second portion, the forming including patterning the etch stop layer to form a plate portion of the capacitor.

18. The method of claim 17, wherein the etch stop layer includes polysilicon or silicon nitride.

19. The method of claim 17, wherein the hard mask layer includes silicon oxide or silicon oxy-nitride.

20. The method of claim 17, wherein implanting the plurality of dopant ions includes implanting boron dopants with an implantation energy greater than 50 KeV and with a dose level of about $1\times10^{13}$ atoms/cm$^2$.

* * * * *